United States Patent
Bugge et al.

(10) Patent No.: US 9,245,748 B2
(45) Date of Patent: Jan. 26, 2016

(54) METHODS FOR GROWING III-V MATERIALS ON A NON III-V MATERIAL SUBSTRATE

(75) Inventors: Renato Bugge, Trondheim (NO); Geir Myrvagnes, Trondheim (NO); Tron Arne Nilsen, N-Vega (NO)

(73) Assignee: Integrated Optoelectronics AS, Trondheim (NO)

(*) Notice: Subject to any disclaimer, the term of this patent is extended or adjusted under 35 U.S.C. 154(b) by 88 days.

(21) Appl. No.: 14/239,967

(22) PCT Filed: Aug. 22, 2012

(86) PCT No.: PCT/EP2012/066299
§ 371 (c)(1),
(2), (4) Date: Mar. 27, 2014

(87) PCT Pub. No.: WO2013/026858
PCT Pub. Date: Feb. 28, 2013

(65) Prior Publication Data
US 2014/0291810 A1    Oct. 2, 2014

(30) Foreign Application Priority Data
Aug. 22, 2011   (EP) .................... 11178305

(51) Int. Cl.
*H01L 21/02*    (2006.01)
*H01L 21/20*    (2006.01)
(Continued)

(52) U.S. Cl.
CPC ........ *H01L 21/02549* (2013.01); *C30B 23/025* (2013.01); *C30B 23/066* (2013.01);
(Continued)

(58) Field of Classification Search
CPC .............. H01L 21/0254; H01L 21/02458; H01L 29/2003; H01L 33/007; H01L 21/02381; H01L 21/02433; H01L 21/02639; H01L 21/02631; H01L 21/02538; H01L 21/02609; H01L 21/02658; H01L 31/184; H01L 31/0687; H01L 31/1844; H01L 33/0075
USPC .................................................. 257/610–620
See application file for complete search history.

(56) References Cited

U.S. PATENT DOCUMENTS

2008/0206966 A1* 8/2008 Huffaker et al. .............. 438/479

FOREIGN PATENT DOCUMENTS

CN    100 495 646    6/2009

OTHER PUBLICATIONS

Hideyuki Toyota et. al., Growth and characterization of GaSb/AlGaSb multi-quantum well structures on Si (0 0 1) substrates, Journal of Crystal Growth 310 (2008) 78-82.*

(Continued)

*Primary Examiner* — Marcos D. Pizarro
*Assistant Examiner* — Nelson Garces
(74) *Attorney, Agent, or Firm* — Nixon Peabody LLP

(57) ABSTRACT

The present invention relates to a method for manufacturing semiconductor materials comprising epitaxial growing of group III-V materials, for example gallium arsenide (GaAs), on for example a non III-V group material like silicon (Si) substrates (wafers), and especially to pre-processing steps providing a location stabilization of dislocation faults in a surface layer of the non III-V material wafer in an orientation relative to an epitaxial material growing direction during growing of the III-V materials, wherein the location stabilized dislocation fault orientations provides a barrier against threading dislocations (stacking of faults) from being formed in the growing direction of the III-V materials during the epitaxial growth process.

14 Claims, 3 Drawing Sheets

(51) Int. Cl.
| | |
|---|---|
| H01L 21/44 | (2006.01) |
| H01L 21/768 | (2006.01) |
| H01L 29/205 | (2006.01) |
| C30B 23/02 | (2006.01) |
| C30B 29/42 | (2006.01) |
| C30B 23/06 | (2006.01) |

(52) U.S. Cl.
CPC ......... *C30B 29/42* (2013.01); *H01L 21/02381* (2013.01); *H01L 21/02463* (2013.01); *H01L 21/02466* (2013.01); *H01L 21/02502* (2013.01); *H01L 21/02521* (2013.01); *H01L 21/02546* (2013.01); *H01L 21/02617* (2013.01); *H01L 21/02631* (2013.01); *H01L 21/02661* (2013.01); *H01L 29/205* (2013.01)

(56) References Cited

OTHER PUBLICATIONS

G. Balakrishnan et. al., Growth mechanisms of highly mismatched AlSb on a Si substrate, Applied Physics Letters 86, 034105 (2005).*

S.H. Huang et. al., Epitaxial growth and formation of interfacial misfit array for tensile GaAs on GaSb, Applied Physics Letters 90, 161902 (2007).*

Huffaker et. al., Monolithic Integration of Sb-based Photopumped Lasers on Si, 2nd IEEE International Conference on Group IV Photonics, pp. 149-150 (2005).*

Ganesh Balakrishnan et. al., Room-Temperature Optically Pumped (Al)GaSb Vertical-Cavity Surface-Emitting Laser Monolithically Grown on a Si(100) Substrate, IEEE Journal of Selected Topics in Quantum Electronics, vol. 12, No. 6, Nov./Dec. 2006, pp. 1636-1641.*

AIP, Applied Physics Letters, Epitaxial growth and information of interfacial misfit array for tensile GaAs on GaSb, S. H. Huang, G. Balakrishnan, M. Mehta, A. Khoshakhlagh, L. R. Dawson, D. L. Huffaker, and P. Li, Downloaded Nov. 25, 2014, 4 pages.

Ganesh Balakrishnan et al; Room-Temperature Optically Pumped (Al) GaSb Vertical-Cavity Surface-Emitting Laser Monolithically Grown on an Si(1 0 0) Substrate, IEEE Jornal of Selected Topics in Quantum Electronics, vol. 12, No. 6, dated Nov./Dec. 2006, 6 pages.

Growth mechanisms of highly mismatched AlSb on a Si substrate, G. Balakrishnan, S. Huang, L. R. Dawson, Y.-C. Xin, P. Conlin, and D. L. Huffaker, Downloaded http://dx.doi.org/10.1063/1.1850611, downloaded Nov. 25, 2014, 4 pages.

Hideyuki Toyota et al; Growth and characterization of GaSb/AlGaSb multi-quantum well structure on Si (0 0 1) substrates, ScienceDirect Journal of Crystal Growth 310 (2008), Department of Electrical Engineering, Nagaoka University of Technology, 1603-1 Kamitomioka-cho, Nagaoka 940-2188, Niigata, Japan, Communicated by E. Calleja, Available online Oct. 10, 2007, pp. 78-82.

International Search Report, PCT/EP2012/066299, date of mailing May 10, 2012, 4 pages.

International Written Opinion, PCT/EP2012/066299, date of mailing May 10, 2012, 6 pages.

\* cited by examiner

METHODS FOR GROWING III-V MATERIALS ON A NON III-V MATERIAL SUBSTRATE

A method for growing III-V materials on a non III-V material substrate comprising steps improving dislocation fault density of a finished material structure suitable for use in semiconductor manufacturing and semiconductor applications.

CROSS-REFERENCE TO RELATED APPLICATIONS

This application is a U.S. National Stage of International Application No. PCT/EP2012/066299, filed Aug. 22, 2012, which claims the benefit of European Patent Application No. 11178305.6, filed Aug. 22, 2011, both of which are incorporated herein by reference in their entireties.

FIELD OF THE INVENTION

The present invention relates to a method for manufacturing semiconductor materials comprising epitaxial growing of group III-V materials, for example gallium arsenide (GaAs), on for example a non III-V group material like silicon (Si) substrates (wafers), and especially to pre-processing steps providing a location stabilisation of dislocation faults in a surface layer of the non III-V material wafer in an orientation relative to an epitaxial material growing direction during growing of the III-V materials, wherein the location stabilised dislocation fault orientations provides a barrier against threading dislocations (stacking of faults) from being formed in the growing direction of the III-V materials during the epitaxial growth process.

BACKGROUND OF THE INVENTION

Modern semiconductor industry has provided a revolution in our lives and has been the foundation for developing computer industry and electronic devices we now cannot live without. The economic significance of the semiconductor industry in our society is of utmost importance.

Behind this scientific, technical and economic evolution is the material science of semiconductor materials. Transistors, lasers and solar cell assemblies converting light into electricity etc. relies on cheap and reliable semiconductor materials. However, there are still needs for improvements in the material properties, for example increasing speed and limiting power consumption in transistors, providing more efficient lasers and lately improving the electric power output from semiconductor solar cells. When it comes to solar cell assemblies it is also of utmost importance to provide semiconductor materials providing highest possible efficiency at the lowest possible cost of materials. It is also important to be able to produce huge quantities of semiconductors with a high yield factor. All these desired properties of semiconductors may be fulfilled completely or partially by manufacturing semiconductor materials with the correct physical properties, as known to a person skilled in the art, as basis materials for these semiconductor devices and manufacturing thereof.

In the field of semiconductor material science it is well known that gallium arsenide (GaAs) has many desirable properties as a foundation for semiconductors. The mobility and other physical properties of this material can increase the speed of semiconductor devices made from this material significantly compared with the more traditional semiconductor materials like silicon (Si). As known to a person skilled in the art, Si is however much cheaper than GaAs. Therefore, manufacturing of a semiconductor material comprising GaAs on top of a Si wafer is a desirable material combination. Manufacturing of transistors would then provide a high frequency device combined with known Si integrated circuit technology, solar cells would have high efficiency at a low price and lasers could be manufactured with larger scale production with cheaper substrates. Further, integration of optical devices on a same chip comprising integrated electronic circuits will be facilitated.

These preferable properties have been known for a long time in the prior art. However, growing high quality mono-crystalline GaAs on mono-crystalline silicon is not trivial due to the large lattice mismatch of the two materials. When combining these materials, for example in an epitaxial growth process, as known to a person skilled in the art, the lattice mismatch leads to stacking of faults, denoted threading dislocations, that ruins the physical properties necessary for making semiconductor devices that fulfils the desired requirements. The threading dislocations appear for example in a GaAs layer that is being grown on top of a Si wafer. The threading dislocations will have a certain orientation relative to the epitaxial growth direction and the dominant direction is usually close to being parallel or is parallel with the growing direction. The length of the threading dislocations may be shorter than the end thickness of the grown layer, but thickness of layers in semiconductor devices contributes significantly to what kind of physical properties the material will provide as a basis for a semiconductor device, as known to a person skilled in the art. Even though the length of the threading dislocations may be limited, the physical property of the interface between the different materials still needs to be controlled.

In prior art there are known some examples of experimental processes trying to achieve a combination of for example GaAs as a III-V material on non III-V materials that has used relative thick buffer layers and/or strained-layer super lattices to reduce defect densities. For example, a transition, super-lattice and/or buffer layer with a thickness of 1000 Å or more is reported used in experimental methods. This is essential, since such a dimension of a layer with no other function than being a buffer will create extra material costs and production time in addition to being detrimental to device performance. For example: In a solar cell application, this layer will contribute with additional impedance and the layer may absorb light without generating electricity.

M. Yamaguchi, M. Tachikawa, Y. Itoh, M. Sugo, S. Kondo: "Thermal annealing effects of defect reduction in GaAs on Si substrates.", Journal of Applied Physics, Vol. 68, pp. 4518-4522 (1990) shows that thermal annealing can be used to reduce dislocations in GaAs grown directly on (100) Si substrates. Their GaAs layers exhibit a dislocation density at or above $10^8$ cm$^{-2}$ prior to annealing. Using several annealing cycles they achieved dislocation densities as low as $3 \cdot 10^6$ cm$^{-2}$. Yamaguchi et al. also shows a dependency between grown thicknesses and number of dislocations, and that the found dislocation density differs when using different examination techniques (EPD (Etch Pit Density) and TEM (Transmission Electron Microscopy)). The lowest number of dislocations was reported for the specimens at 3500 nm of GaAs on Si after 4 thermal annealing cycles to 900° C.

M. Umeno, T. Kato, M. Yang, Y Azuma, T. Soga, T. Jimbo: <<High efficiency AlGaAs/Si Tandem Solar Cell Over 20%>>, pp. 1679-1684, WCPEC, Hawaii (1994) demonstrated an AlGaAs/Si dual-junction solar cell with only a 10 nm thin GaAs buffer layer at the III-V/Si material interface. No other dislocation barrier was reported used to realise the top solar cell, but still obtained a working AlGaAs cell at a dislocation density of $2 \cdot 10^7 \text{cm}^{-2}$. From theoretical calculations they showed that a $Al_{0.22}Ga_{0.78}As/Si$ dual-junction solar cell could obtain a total conversion efficiency of 32-33%. Their experimental cell was grown with an AlGaAs thickness of 3000 nm, and obtained a top $Al_{0.15}Ga_{0.85}As$ and bottom Si cell efficiency of up to 11.9% and 8.92% respectively. In series the total dual-cell efficiency was shown to be up to 19.9%.

R. J. Malik, J. P. van der Ziel, B. F. Levine, C. G. Bethea and J. Walker: <<Molecular-Beam epitaxy of GaSb/AlSb optical device layers on Si(100)>>, Journal of Applied Physics, Vol. 59, No. 11 (1986) discloses that an AlSb containing layer on Si could enable growth of monocrystalline III-V material with lower dislocation density than what was previously achieved at the time. A pulsed deposition technique was used in which one monolayer of AlSb was deposited one at the time at 400° C. with a 15 s waiting time between the depositions of layers. After a 150 Å layer of AlSb was achieved with this method on Si, a 600 nm thick AlSb buffer at 550° C. was grown. R. J. Malik et al. then used a 50 period 10 nm AlSb/10 nm GaSb superlattice prior to growth of a GaSb/AlGaSb laser structure on top. They attribute the long wavelength of the optically-pumped laser to be due to a tensile stress in the GaSb film, but do not disclose any dislocation density values on their materials.

G. Balakrishnan, S. Huang, A. Khoshakhlagh, P. Hill, A. Amtout, S. Krishna, G. P. Donati, L. R. Dawson, D. L. Huffaker: "Room-temperature optically-pumped InGaSb quantum well lasers monolithically grown on Si(100) substrate", Electronics Letters, v 41, n 9, p 531-2, 28 Apr. 2005 uses the same technique as Malik et al., but uses a substrate temperature of 500® C. during both the initial AlSb growth and subsequent AlSb buffer and AlSb/GaSb superlattice growth. After the superlattice, they grow a AlGaSb/InGaSb laser which is optically-pumped and emits at room-temperature. No dislocation density is mentioned, but in G. Balakrishnan, S. Huang, L. R. Dawson, Y.-C. Xin, P. Conlin, and D. L. Huffaker: "Growth mechanisms of highly mismatched AlSb on a Si substrate", Applied Physics Letters, Vol. 86, pp. 034105-1-3 (2005) they describe the AlSb/Si nucleation process in more detail and mention a misfit dislocation density on the order of $10^{11}$ cm$^{-2}$ in the initial AlSb layer.

Hideyuki Toyota, Tomonori Sasaki, Yoshio Jinbo, Naotaka Uchitomi: "Growth and characterization of GaSb/AlGaSb multi-quantum well structures on Si (001) substrates", Journal of Crystal Growth, Vol. 310, pp. 78-82 (2008) use the same technique as Malik et al. for growth of AlSb/GaSb on Si. They compare the use of thick GaSb buffers with and without GaSb/AlGaSb superlattices with a GaSb/AlGaSb multi-quantum well on top. Although no dislocation density values are given, they show that the X-ray diffraction spectrum of the (004) peak has a full-width-half-maximum value of 0.245 degrees.

S. H. Huang, G. Balakrishnan, M. Mehta, A. Khoshakhlagh, L. R. Dawson, and D. L. Huffaker: "Epitaxial Growth and formation of interfacial misfit array for tensile GaAs on GaSb" Applied Physics Letters 90, 161902 (2007) disclose dislocation densities as low as $3 \cdot 10^6 \text{cm}^{-2}$ provided by a group V soak technique. They achieved this with GaAs on GaSb using an interfacial misfit layer that is formed using a method that relies on As overpressure. Their formation of defects is related to obtaining a Ga-rich surface, due to As exposure of GaSb. They do not report the dislocation density of their GaSb substrates, but commercially available substrates are available with a dislocation density measured by etch pit density (EPD) at 1000 cm$^{-2}$ or 10000 cm$^{-2}$.

According to an aspect of the present invention, harmful threading dislocation faults may be avoided if a dominant threading dislocation direction or stacking of faults does not take place in a direction parallel to or close to the direction of the epitaxial growth, or is stopped completely. For example, if threading dislocation faults are constrained to be parallel or at least close to parallel to a surface of a wafer, for example a Si wafer, the threading dislocations will not appear in the material that is grown in the process, The dislocation faults will be constrained at the surface or close to the surface of the wafer and therefore appear as location stabilised in respective positions at this interface. This controlling of the dislocation faults makes it possible to grow GaAs on top of a wafer providing low defect densities for the complete manufactured material. This aspect of the present invention is achieved by pre-processing steps comprising a controlled and defined temperature, pressure and time interval exposure of material combinations. The relation between these three parameters has been established experimentally.

According to an example of embodiment of the present invention, a method for epitaxial growth of III-V group materials on Si wafers comprises pre-processing steps executed before growing the actual III-V group materials on the Si wafer, wherein the pre-processing steps comprises growing a AlSb nucleation layer on top of the Si wafer followed by growing a GaSb layer on the AlSb nucleation layer, wherein this three layer composition is exposed to a low pressure condition over a certain time and substrate temperature. These pre-processing steps provides a defect density as low as 2000 cm$^{-2}$ which is much lower compared to results reported in the prior art.

OBJECT OF THE INVENTION

It is a further object of the present invention to provide an alternative to the prior art.

In particular, it may be seen as an object of the present invention to provide a method for manufacturing III-V group materials on non III-V group materials that solves the above mentioned problems of the prior art with a set of pre-processing steps and treatment steps executed during manufacturing of materials.

It is further an object of the present invention to provide III-V materials on Si material suitable for manufacturing high speed transistors.

It is further an object of the present invention to provide a III-V group materials on Si material suitable for manufacturing optical devices with reduced cost and that at the same time can be integrated on a same chip comprising electronic devices.

It is further an object of the present invention to provide III-V materials on Si material suitable for solar cell manufacturing, wherein the III-V materials provides high conversion efficiency of light to electric current while the Si material provides low cost and high mechanical stability of the solar cells.

It is further an object of the present invention to provide semiconductor materials involving non-group III materials being added to make comparable compound semiconductors on silicon, through a method according to the present invention, for example is a combination of III-V, II-VI, I-VIII, I-VI, III, VI, II-V materials with the intention to establish a semiconductor layer on top of Si, with an Al containing nucleation layer and another compound semiconductor layer between the Al containing layer and the topmost compound semiconductor layer, and a interfacial misfit layer between the two compound semiconductor layers.

SUMMARY OF THE INVENTION

Thus, the above described object and several other objects are intended to be obtained in a first aspect of the invention by providing a method comprising A first step cleaning a substrate or wafer comprising a non III-V material, a second step comprising epitaxial growing of a nucleation layer, a third step comprising epitaxial growing of a III-V group bulk material, a fourth step comprising performing a material treatment of the material combination from above and fifth step comprising growing of III-V material on top of the treated material from the step above.

The individual aspects of the present invention may each be combined with any of the other aspects. These and other aspects of the invention will be apparent from the following description with reference to the described embodiments.

BRIEF DESCRIPTION OF THE FIGURES

The method of growing III-V materials on non III-V materials according to the present invention will now be described in more detail with regard to the accompanying figures. The figures illustrates examples of embodiments of the present invention and is not to be construed as being limiting to other possible embodiments falling within the scope of the attached claim set.

DETAILED DESCRIPTION OF AN EMBODIMENT OF THE PRESENT INVENTION

Figure 1:
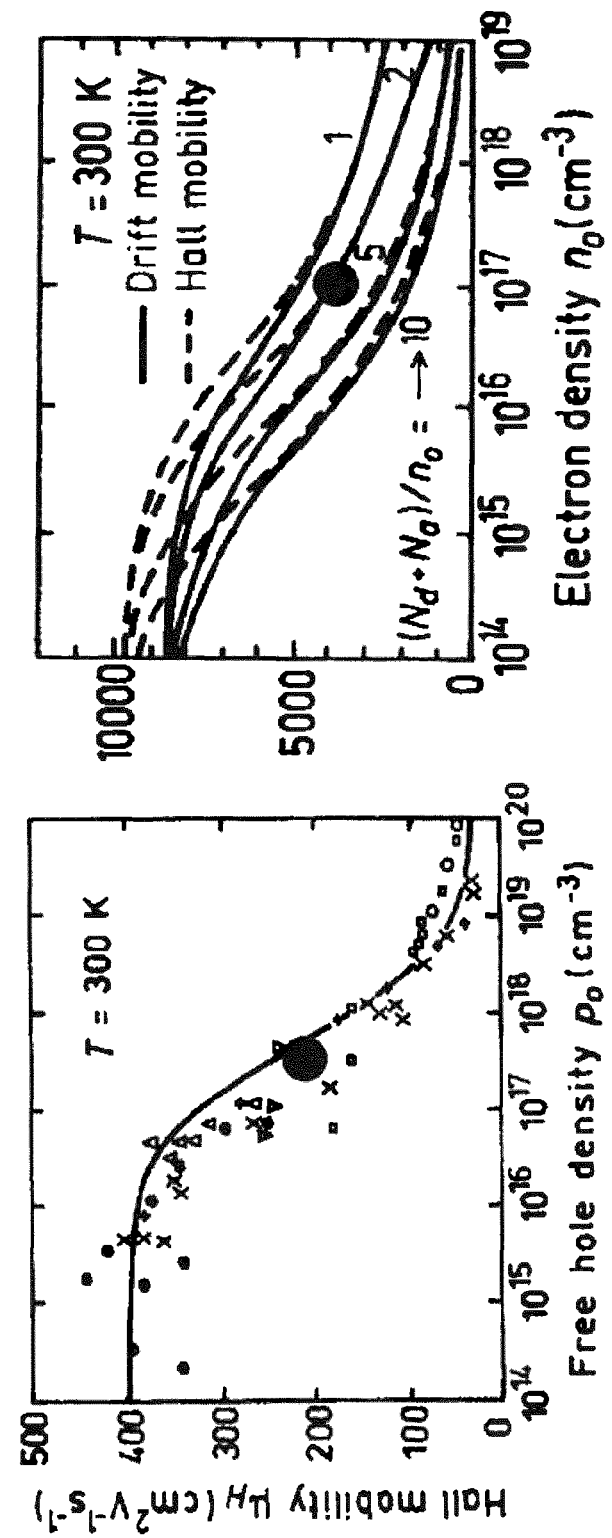
FIG. 1 illustrates a comparison of the critical material property of mobility of a material manufactured according to the present invention with bulk GaAs as reported in prior art.

Although the present invention has been described in connection with the specified embodiments, it should not be construed as being in any way limited to the presented examples. The scope of the present invention is to be interpreted in the light of the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

According to an example of embodiment of the present invention, a method for epitaxial growth of III-V group materials on non III-V group materials comprises five main steps:

1. Cleaning a substrate or wafer comprising the non III-V material.
2. Epitaxial growing of a nucleation layer within a range of 5 to 50 Å thickness.
3. Epitaxial growing of a III-V group bulk material to at least 500 Å thickness.
4. Perform a material treatment of the material combination from 1, 2 and 3 according to the present invention.
5. Epitaxial growing of the III-V material on top of the material from step 4.

Step one and five are both known in the prior art. For example, step 1 may be performed to get rid of oxides. This involves for example either etching the Si surface, or heating the non III-V material wafer in vacuum to 850° C.-1350° C. under Gallium flux, or as a combination of etching and heating procedures.

Step five may be performed as known to a person skilled in the art, for example in a Molecular Beam Epitaxy (MBE) machine. The steps performed in step two and three is also known in prior art. However, the combination of the materials and thickness targets from step two and three may be regarded as a pre-processing comprising a nucleation layer and a respective bulk material layer that undergoes the treatment according to the present invention in step four that provides the unique results of the present invention.

According to an example of embodiment of the present invention the following steps are performed for manufacturing GaAs on a Si wafer:

1. Cleaning the Si surface to get rid of oxides.
2. Growing an AlSb nucleation layer onto a Si wafer surface with a layer thickness between 5 Å and 50 Å, for example to a thickness of 25 Å.
3. Growing a GaSb layer on top of the AlSb nucleation layer from step 2., thereby providing a bulk III-V layer, wherein the thickness of the bulk GaSb layer is in the range of 500 Å to 5000 Å, for example 500 Å.
4. Providing an interfacial misfit layer through low pressure exposure of the GaSb surface provided for from step 1., 2., and 3., with a pressure in the range of $1 \cdot 10^{-8}$ Torr-$3 \cdot 10^{-8}$ Torr, for example at $3 \cdot 10^{-8}$ Torr, with a wafer substrate temperature in the range of 400° C. to 600° C., for example at 479° C., for a time interval between 20 seconds to 70 minutes, for example for 20 seconds.
5. Growing GaAs onto the GaAs surface from step 4.

According to another example of embodiment of the present invention, a thinner layer than 500 Å may be used in step 3. The heating in step 4 may be controlled by controlling a temperature controller as known to a person skilled in the art. However, due to the smaller and direct band gap of GaSb compared to Si, the real temperature of the grown layer increases as it is grown, so that one may need to ramp the thermal controller to a lower temperature during growth to counteract this effect. For example if a thermocouple behind the Si wafer is used for thermal control the surface temperature and the temperature shown by the thermal controller will deviate more and more as GaSb layer thickness increases. For example, for a 5000 Å thick layer a thermal controller ramp down of 60° C. (from 500° C. to 440° C.) for 5000 Å thick GaSb layers is necessary. Surface temperatures (for example measured by a pyrometer on the growth surface) may be used. Using other materials alone or in addition to listed materials is within the scope of the present invention. However, temperature ramping may be necessary to avoid destroying material properties.

The dislocation transition from GaSb to GaAs may also be used for other composition of III-V materials containing a mixture of two or more group III compounds. An example is the growth of AlGaSb and AlGaAs instead of GaSb and GaAs. Variations in this would yield III-V materials with Ga, Al and In with different and useful properties. The group V composition could also be varied, yielding even more complexity and freedom to customize the materials.

Other semiconductor materials involving non-group III materials may be added to make comparable compound semiconductors on silicon, through the method used above. An example is a combination of III-V, II-VI, I-VIII, I-VI, III, VI, II-V materials with the intention to establish a semiconductor layer on top of Si, with an Al containing nucleation layer and another compound semiconductor layer between the Al containing layer and the topmost compound semiconductor layer, and a interfacial misfit layer between the two compound semiconductor layers.

One or several respective dopants may be added during growth processes to obtain an electrical contact between the Si and the topmost semiconductor layer. An example is contacts to n-Si with a thin AlSb layer (non-intentionally doped), n-GaSb (Te doped) and n-GaAs (Te doped). A n+/p+ tunnel-junction contact layer may be grown on top of the n-GaAs to prepare for further p-type growth.

The temperature range indicated in the example of embodiment of 400° C. to 600° C. may be varied further. One reason can be temperature sensitive compounds being used in the manufacturing process. The relationship between temperature exposure and length of time interval may be established empirically for a specific production facility. However, there is established a preferable time interval of 20 seconds as a preferable limit for the process. If the temperature is lower the time interval must increase and vice versa. The pressure (or vacuum) should at no instance be more than $3 \cdot 10^{-8}$ Torr. At higher pressures, impurities or materials may contaminate the surface through adsorption providing probably worse material quality. Hydrogen, helium or similar gases are exceptions to this as long as adsorption rates of these gas molecules are low. Usually cost effective production of materials according to the present invention should be produced as quickly as possible. Therefore, it is a target to be able to keep the time interval as short as possible for the exposure, for example for 20 seconds.

By using this method according to the present invention, a material quality of respective III-V materials for a variety of devices has been proven. A dislocation density as low as 2000 $cm^{-2}$ measured by etch pit density (EPD) has been achieved, which is comparable to dislocation densities in III-V substrates used for demanding applications like lasers. Mobility measurements in GaAs grown with this method according to the present invention have shown that the electron- and hole-mobilities are the same as would be expected from bulk GaAs. Examples: $n=1.0 \cdot 10^{17}$ $cm^{-3}$ gave a mobility of 3780 $cm^2/Vs$. $p=3.8 \cdot 10^{17}$ $cm^{-3}$ gave a mobility of 211 $cm^2/Vs$. These are typical doping levels that would be used in various devices, like lasers, diodes, transistors and solar cells.

FIG. 1 illustrates mobility measurements of GaAs grown on Si substrates according to an example of embodiment according to the present invention compared to values from literature for bulk GaAs. The obtained result according to the present invention is marked as a circular dot in the diagrams. The figure illustrates respectively mobility of holes and electrons. The Y axis is the measured hole mobility in the diagram for the hole mobility while the y axis is the measured mobility for electrons in the diagram for the electrons. References: Rode, D. L., Semiconductors and Semimetals, R. K. Willardson and A. C. Beer, eds., Academic Press, N.Y., vol. 10, 1975, p. 1. and Wiley, J. D., Semiconductor and Semimetals, R. K. Willardson and A. C. Beer, eds., Academic Press, N.Y., vol. 10, 1975, p. 91.

Figure 2:
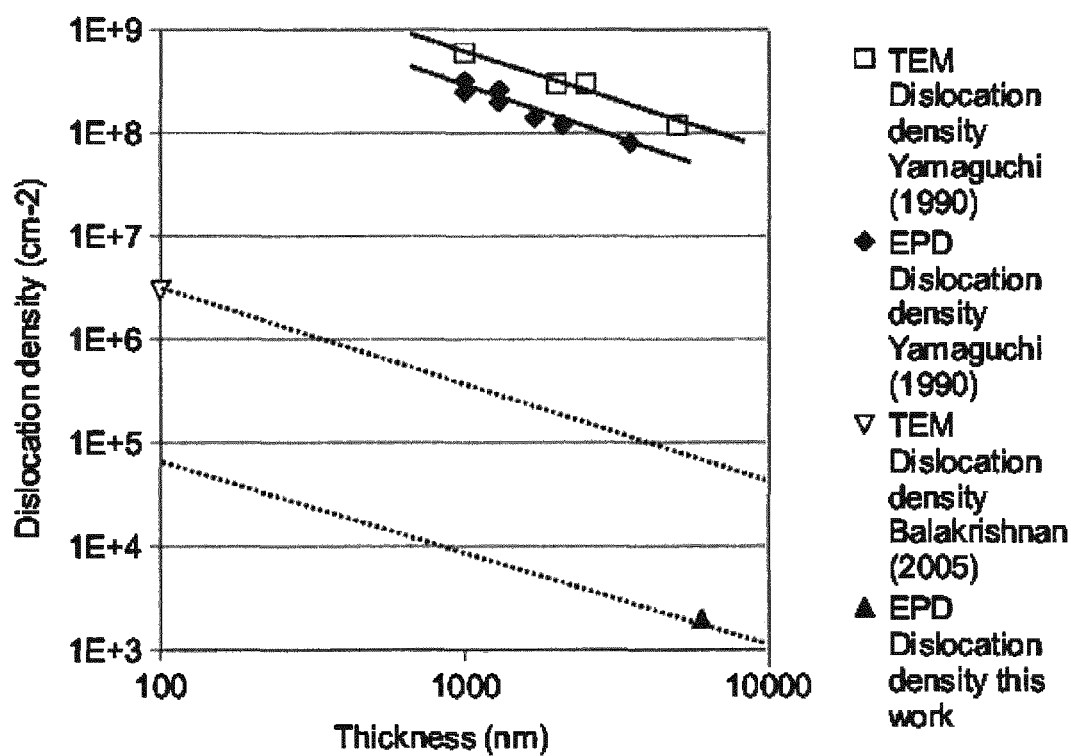
FIG. 2 illustrates dislocation densities of reported materials with results obtained with embodiments of the present invention.

FIG. 2 illustrates dislocation densities as a function of material thickness. In the figure three reported prior art results are plotted together with results obtained according to an example of embodiment of the present invention. The figure disclose how the present invention provides a significant improvement of dislocation faults in III-V group materials on non III-V group materials. The results are in conformity with the results disclosed for the mobility in FIG. 1.

Figure 3:
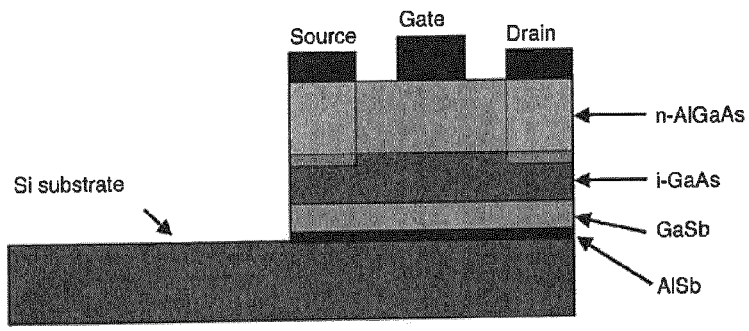
FIG. 3 illustrates a typical structure of a transistor manufactured from III-V group materials on Si.

FIG. 3 illustrates a typical transistor application of a GaAs on Si material according to the present invention. The illustrated example is a typical High Electron Mobility Transistor (HMT) design as known to a person skilled in the art. As readily understood, manufacturing of a transistor with a material according to the present invention may be achieved as known to a person skilled in the art.

Figure 4:
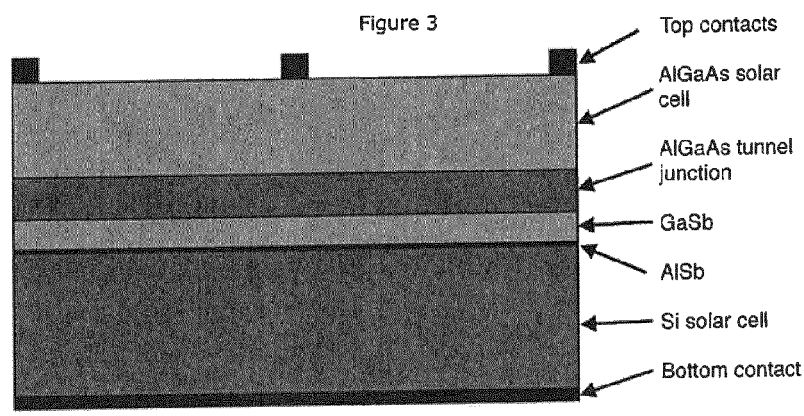
FIG. 4 illustrates a typical structure of a solar cell manufactured from III-V group materials on Si.

FIG. 4 illustrates a typical design of a solar cell comprising a material according to the present invention. Again the illustration exemplifies that a solar cell may be designed as known to a person skilled in the art when using a material according to the present invention.

Figure 5:
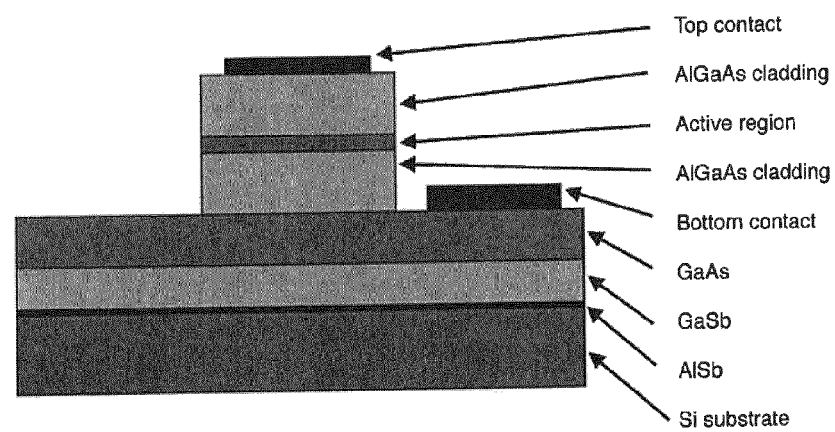
FIG. 5 illustrates a typical structure of a laser manufactured from III-V group materials on Si.

FIG. 5 illustrates a typical laser design as known to a person skilled in the art. The use of a material according to the present invention does not involve any change of the structure to achieve a laser function.

According to an example of embodiment of the present invention a method for epitaxial growing of at least one III-V group material on top of a substrate or wafer of a non III-V group material, comprises steps for providing a pre-processing of a clean wafer with a respective first deposited nucleation layer and a respective second deposited bulk material layer, the material composition from the pre-processing steps is further treated to form an interfacial misfit layer by exposing the material composition from the pre-processing steps to a low pressure in a range of $1 \cdot 10^{-8}$ Torr to $3 \cdot 10^{-8}$ Torr, at a temperature in the range of 400° C. to 600° C. for a time interval of 10 seconds to 70 minutes, wherein the treated material composition from the pre-processing steps further is grown in an epitaxial process with the at least one III-V group material.

According to another example of embodiment of the present invention, a first deposited nucleation layer is formed by aluminium antimonide (AlSb) on a surface of a silicon (Si) wafer, and a second deposited bulk layer is formed by gallium antimonide (GaSb).

According to another example of embodiment of the present invention a first deposited nucleation AlSb layer is provided for with a thickness in a range of 5 Å to 50 Å.

According to another example of embodiment of the present invention a second deposited bulk GaSb layer is provided for with a thickness in a range of 5 Å to 5000 Å.

According to another example of embodiment of the present invention a first deposited nucleation layer is formed by aluminium (Al).

According to another example of embodiment of the present invention a temperature range is controlled by a thermal controller being ramped down to lower the temperature if any material being processed is sensitive to a certain temperature level.

According to another example of embodiment of the present invention a second bulk layer is formed by aluminium gallium arsenide (AlGaSb), and the at least one III-V group material is aluminium gallium arsenide (AlGaAs).

According to another example of embodiment of the present invention a second bulk layer and the at least one III-V group material comprises respective compounds of at least one of the materials from the group of materials gallium (Ga), aluminium (Al) and indium (In).

According to another example of embodiment of the present invention a first nucleation layer is formed by aluminium (Al) and other materials used in the embodiment is a combination of materials from group III-V materials, II-VI materials, I-VIII materials, I-VI materials, VI materials, II-V materials on top of a silicon (Si) wafer.

According to another example of embodiment of the present invention a first deposited nucleation layer is formed by aluminium antimonide (AlSb) with a thickness of 25 Å, the second bulk layer is formed by gallium antimonide (GaSb) with a thickness of 500 Å, the treatment is provided for by a pressure of $3 \cdot 10^{-8}$ Torr at a temperature of 497° C. for a time interval of 20 seconds.

It is further within the scope of the present invention that variations in the process parameters up to about +/−5% in typical production equipment would not be large enough to make examples of embodiments according to the present invention to fail for a significant portion of the manufactured devices. Typical non-uniformity in temperature (+/−5%) is smaller than the range of temperatures that have been shown to work. The device characteristics will of course vary with non-uniformity in composition of the grown layers. However, the critical steps shown above have sufficiently large acceptable ranges not to fail because of this.

DEFINITIONS

Ga—Gallium
Al—Aluminium
In—Indium
As—Arsenic
Sb—Antimony
Si—Silicon
Te—Tellurium
Be—Beryllium
AlSb—Aluminium antimonide
GaAs—Gallium arsenide
GaSb—Gallium antimonide
AlGaAs—Aluminium gallium arsenide
AlGaSb—Aluminium gallium antimonide
n-GaAs, p-GaAs n- or p-doped GaAs
III-V and other combinations of Roman numerals—Compound semiconductors with elements from (in this case) group III and V of the periodic table of elements.
(001)—a crystallographic orientation
EPD—Etch pit density
TEM—Transmission electron microscopy
XRD—X-ray diffraction
FWHM—Full width at half maximum

The invention claimed is:

1. A method for epitaxial growing of at least one III-V group material on top of a substrate or wafer of a non III-V group material, wherein the method comprises a step of providing a pre-processing of a clean wafer with a respective first deposited nucleation layer and a respective second deposited bulk material layer, wherein the material composition formed in the pre-processing step is further treated to form an interfacial misfit layer by exposing the material composition from the pre-processing step to a low pressure in a range of $1 \cdot 10^{-8}$ Torr to $3 \cdot 10^{-8}$ Torr, at a temperature in the range of 400° C. to 600° C. for a time interval of 10 seconds to 70 minutes before the treated material composition from the pre-processing step further is grown in an epitaxial process with the at least one III-V group material.

2. The method according to claim 1, wherein the first deposited nucleation layer is formed by aluminium antimonide (AlSb) on a surface of a silicon (Si) wafer, and the second deposited bulk layer is formed by gallium antimonide (GaSb).

3. The method according to claim 2, wherein the first deposited nucleation AlSb layer is provided for with a thickness in a range of 5 Å to 50 Å.

4. The method according to claim 2, wherein the second deposited bulk GaSb layer is provided for with a thickness in a range of 5 Å to 5000 Å.

5. The method according to claim 1, wherein the temperature range is controlled by a thermal controller being ramped down to lower the temperature if any material being processed is sensitive to a certain temperature level.

6. The method according to claim 1, wherein the second bulk layer is formed by aluminium antimonide (AlGaSb) and the at least one III-V group material is formed by aluminium gallium arsenide (AlGaAs).

7. The method according to claim 1, wherein the second bulk layer and the at least one III-V group material comprises respective compounds of at least one of the materials from the group of materials gallium (Ga), aluminium (Al) and indium (In).

8. The method according to claim 1, wherein the first nucleation layer is formed by aluminium (Al) and other materials used in the method is a combination of materials from group III-V materials, II-VI materials, I-VIII materials, I-VI materials, VI materials, II-V materials on top of a silicon (Si) wafer.

9. The method according to claim 1, wherein the first deposited nucleation layer is formed by aluminium antimonide (AlSb) with a thickness of 25 Å, the second bulk layer is formed by gallium antimonide (GaSb) with a thickness of 500 Å, the treatment is provided for by a pressure of 3·10-8 Torr at a temperature of 497° C. for a time interval of 20 seconds.

10. Use of a material manufactured according to a method according to claim 1 for transistors.

11. Use of a material manufactured according to a method according to claim 1 for lasers.

12. Use of a material manufactured according to a method according to claim 1 for solar cells.

13. Use of a material manufactured according to a method according to claim 1 for optical devices.

14. Use of a material manufactured according to a method according to claim 1 for optical devices integrated onto silicon wafers comprising electronic circuitry.

* * * * *